(12) United States Patent
Schaetz

(10) Patent No.: US 6,890,689 B2
(45) Date of Patent: May 10, 2005

(54) METHOD FOR FABRICATING A MASK CONFIGURATION

(75) Inventor: Thomas Schaetz, Buchbach (DE)

(73) Assignee: Infineon Technologies AG, Munich (DE)

( * ) Notice: Subject to any disclaimer, the term of this patent is extended or adjusted under 35 U.S.C. 154(b) by 244 days.

(21) Appl. No.: 10/228,239

(22) Filed: Aug. 26, 2002

(65) Prior Publication Data

US 2003/0039900 A1 Feb. 27, 2003

(30) Foreign Application Priority Data

Aug. 24, 2001 (DE) .......................................... 101 41 497

(51) Int. Cl.$^7$ .............................. G03F 9/00; G03F 7/00
(52) U.S. Cl. .......................... 430/5; 430/322; 430/323
(58) Field of Search ............................ 430/5, 322, 323

(56) References Cited

U.S. PATENT DOCUMENTS

| | | | | | |
|---|---|---|---|---|---|
| 6,453,274 | B2 | * | 9/2002 | Kamon | 703/2 |
| 6,492,073 | B1 | * | 12/2002 | Lin et al. | 430/5 |
| 6,534,242 | B2 | * | 3/2003 | Sugita et al. | 430/312 |
| 6,677,088 | B2 | * | 1/2004 | Magome et al. | 430/5 |

* cited by examiner

Primary Examiner—Amanda Walke
(74) Attorney, Agent, or Firm—Laurence A. Greenberg; Werner H. Stemer; Ralph E. Locher

(57) ABSTRACT

During the fabrication of a mask, to substantially avoid systematic deviations from a desired configuration of recesses that will be formed in the mask, the patterning of the mask substrate is carried out in a sequence of subprocesses. The subprocesses are matched to one another such that the deviations that are formed from these subprocesses compensate for one another, so that in this way, error correction is achieved.

36 Claims, 5 Drawing Sheets

Fig_5

METHOD FOR FABRICATING A MASK CONFIGURATION

BACKGROUND OF THE INVENTION

Field of the Invention

The invention relates to a method for fabricating a mask configuration. In particular, the invention relates to a method for fabricating a photomask, an etching mask or the like, for semiconductor technology.

Mask configurations are used in a number of process steps in various fabrication methods used in the semiconductor industry. By way of example, etching masks are used for patterning semiconductor materials, the masks resting on the semiconductor material or the like and being suitably patterned by means of a photolithography process. When etching masks of this type are being formed, the exposure requires corresponding photomasks, into which, in a suitably designed fabrication method, the corresponding pattern information for the semiconductor pattern is introduced.

The present invention relates both to the fabrication of the etching masks and to the fabrication of the photomasks on which these etching masks are based. Both fabrication methods involve a number of basic method steps, for which the invention proposes improvements.

In conventional methods for fabricating a mask configuration, first of all a carrier substrate is formed or provided, with a surface region of the carrier substrate being provided accordingly. Then, the actual mask substrate is formed on the surface region of the carrier substrate. Then the mask substrate is patterned in accordance with the present and desired pattern information, so that accordingly a mask with a configuration of recesses in the mask substrate is formed. The recesses in the mask substrate extend from the surface region of the mask substrate to the surface region of the carrier substrate beneath it. Depending on the choice of carrier and of the mask substrate, the mask which has been patterned in this way can be used either as a photomask or as an etching mask.

It has emerged that, in the step of patterning the mask substrate, which if appropriate may involve a plurality of partial steps, the transfer of the pattern information, which is present and which defines a desired mask structure with a desired configuration of recesses, to the mask substrate does not take place without errors. First of all, there are random deviations of the configuration of recesses which is produced in the mask substrate compared to a desired configuration.

Secondly, however, there may also be systematic deviations in the configuration of recesses which can be produced in the mask substrate from the desired configuration.

Considerable efforts have been made to minimize these deviations from the desired configuration. The multiplicity of process parameters are usually matched to one another during the patterning. However, this procedure has proven disadvantageous since it is complex in terms of process technology and since, on account of the large number of parameters, it is not readily possible to take account of a new systematic deviation which occurs suddenly. A further drawback is that the parameters cannot easily be experimented with, for example in order to optimize other substeps of the patterning operation, since this would destroy an existing favorable setting with regard to the pattern deviations.

The need to avoid the pattern deviations by optimum selection of parameters for all the parameters means that the process flow of the fabrication method is inflexible.

SUMMARY OF THE INVENTION

It is accordingly an object of the invention to provide a method a method for fabricating a mask configuration which overcomes the above-mentioned disadvantages of the prior art methods of this general type.

In particular, it is an object of the invention to provide a method for fabricating a mask configuration in which deviations from a desired pattern in the formed pattern of the mask can be minimized as simply as possible.

With the foregoing and other objects in view there is provided, in accordance with the invention, a method for fabricating a mask configuration, which includes steps of: providing a carrier substrate having a surface region; forming a mask substrate on the surface region of the carrier substrate; patterning the mask substrate to form a mask with a configuration of recesses therein extending from a surface region of the mask substrate to the surface region of the carrier substrate; performing a sequence of at least two subprocesses to carry out a process selected from a group consisting of the patterning of the mask substrate and a substep of the patterning of the mask substrate; and performing the subprocesses such that deviations in the configuration of the recesses in the mask, from a desired configuration, which occur as a result of each of the subprocesses, are compensated for as much as possible by a compensation, which is selected from a group consisting of a local compensation and a global compensation, such that the configuration of the recesses in the mask deviates as little as possible from the desired configuration, and as a result, the process selected from the group consisting of the patterning of the mask substrate and the substep of the patterning of the mask substrate is carried out with error correction.

In other words, the method for fabricating a mask configuration, in particular a photomask, an etching mask or the like, for semiconductor technology is characterized in that the patterning of the mask substrate or a substep thereof is carried out in a sequence of at least two subprocesses. The subprocesses are selected and/or managed in such a way that deviations, from a desired configuration in the configuration of the recesses in the mask, which occur as a result of each of the subprocesses per se, are locally and/or globally compensated for as much as possible such that the configuration of the recesses in the mask that is formed deviates as little as possible from the desired configuration, and as a result, the patterning and/or the substep thereof are carried out with error correction.

Therefore, a basic idea of the present invention is to leave the individual step of patterning the mask substrate per se afflicted with errors, since the attempt to eradicate errors in individual steps of the patterning method or the patterning step involves considerable outlay and would lead to complicated readjustment even in the event of extremely minor deviations from a desired result. Instead, according to the invention, it is proposed for individual steps of the patterning step to be left afflicted with errors, and for the patterning step to be divided into a plurality of subprocesses which are afflicted with errors. The subprocesses are selected and/or managed such that the deviations or errors that result individually from the respective subprocesses, after the subprocesses have been carried out in succession as an overall patterning method, cancel one another out.

For example, consideration may be given to linking a subprocess which systematically, in a defined subregion of the mask substrate, always produces pattern elements that are too large with a further subprocess which in the same section of the mask substrate, always produces pattern elements that are too small. Carrying out these subprocesses in succession then means that the errors or deviations precisely cancel one another out, and pattern elements of the correct size are formed.

For example, it is possible for the presence of production steps or patterning steps that are afflicted with errors to be used beneficially by suitably controlling or regulating the combination of the production steps or patterning steps. The outlay involved in selecting and forming corresponding subprocesses that are afflicted with errors is significantly lower than the complex overall outlay required to adjust an overall patterning procedure in order to be free from errors as much as possible by suitably selecting all of the multifarious parameters.

In principle, during the patterning of the mask substrate, substeps which with regard to process technology have nothing to do with one another, for example, are separate in terms of time, and/or substeps which involve fundamentally different method steps and techniques can be matched to one another.

However, it is particularly advantageous if, according to a particularly preferred embodiment of the method for fabricating a mask configuration, a continuous or inherent substep is carried out in a sequence of subprocesses. By way of example, consideration may be given to dividing an etching step that is usually carried out continuously into two etching steps. The etching steps are matched to one another accordingly, such that deviations which precisely cancel one another out result, to thereby produce a pattern which is as close as possible to that desired.

This means that, in particular, substantially similar processes are selected and/or carried out as subprocesses for carrying out the error-corrected patterning of the mask substrate.

In this case, these subprocesses are advantageously defined and/or matched to one another by using their process parameters. This exploits the fact that oppositely directed deviations or misalignments can be described and therefore controlled and/or regulated by using a relatively small number of process parameters, so that a specific setting of errors, in particular, their shape and/or size, can be made easier than the avoidance of errors, which is precisely what the prior art seeks to achieve, in a complex manner.

If subprocesses that are directed oppositely to one another with regard to their deviations or errors are formed or found, it is particularly advantageous if the subprocesses, and in particular, the compensation for the deviations produced by the subprocesses are matched using the process times and/or the process durations. For example, in the example which was presented as an illustration above, namely that of dividing an overall etching step into an etching substep in which the patterns are too large and a second etching substep in which the patterns are too small, with fixed etching rates, it is easily possible to adjust to the feature size that is desired in each case by using the respective etching times, which are then defined by the process duration.

It has been found that many of the deviations that occur in practice are based on systematic process errors. Therefore, it is preferably recommended for a substep with systematic deviations to be carried out with error correction. This is achieved in particular by the error correction of substeps with a footprint structure and/or with radially symmetrical deviations with respect to the lateral extent of the mask substrate, side-to-side deviations and/or the like.

According to one embodiment of the method, there is provided, a multilayer mask substrate having a plurality of individual layers arranged above one another.

It is possible for the individual layers to be patterned together, and to be divided into groups. In another embodiment, the individual layers are in each case patterned independently of one another in an individual patterning method.

In this case, the individual patterning methods are each carried out with error correction individually and/or are matched to one another, in each case using a sequence of suitable subprocesses.

It is particularly preferable for a photoresist layer with a surface region to be formed as the first layer or as the primary mask substrate of the mask substrate.

In this case, the photoresist layer is patterned by exposure and subsequent developing.

The exposure and developing may be carried out alternately or together, are matched to one another with error correction.

In this case, it is provided that the respective substeps are matched to one another, specifically by selecting, controlling and/or regulating at least one of the following variables and/or parameters:

the nature of exposure, the nature of imaging, the type of exposure, in particular electromagnetic radiation, particle radiation and/or the like, the exposure energy and/or exposure wavelength, the exposure dose, the exposure time, the waiting time between exposure and developing, the temperature, pressure and/or atmosphere before, during and/or after the exposure and/or developing, in particular carrying out a heat treatment step after the exposure, a post-exposure bake or the like, the developing medium, the developing temperature, the developing time, the application of the developing medium, in particular spray process, paddle process and/or the like, the developing substeps, breaks, purging steps, and the movement before, during and/or after the exposure, the application of the corresponding developing medium, or the developing and/or purging; this movement is in particular rotation during developing at a rotational speed of 60 to 1000 rpm.

Furthermore, it is possible to provide for a secondary mask substrate to be applied and/or formed as the lower layer of the mask substrate, and for the secondary mask substrate to be patterned using one or more etching steps.

In this context, it is advantageous for at least one etching step to be carried out by wet-chemical means, matching taking place, in order to carry out this step and in particular for error correction, by selecting, controlling and/or regulating at least one of the following variables and/or parameters:

the composition of the etching medium, in particular acid, base, additives and/or the like, the etching temperature, which is in particular between 20° C. nd 30° C., the etching duration, which is in particular in the region of 30 s, the application of the etching medium, in particular spraying, number of nozzles, nozzle position and/or the like, the etching process sequence, if appropriate with interruptions, purging steps and/or the like, and the movement before, during and/or after the application of the etching medium and/or-during the etching and/or the purging; this movement is, in particular, a rotation during the etching and/or purging at a rotational speed of 60 to 1000 rpm.

In addition and as an alternative, it is provided that at least one etching step is carried out by dry-chemical means, and matching takes place, in order to carry out the etching step and in particular the error correction, by selecting, controlling and/or regulating at least one of the following variables and/or parameters:

the type of plasma, the plasma gas and/or process gas, in particular chlorine, oxygen and/or the like, the plasma pressure, gas pressure, the plasma temperature, the excitation frequency of the plasma, the DC voltage for plasma anisotropy, the etching duration, the etching temperature, the external fields, in particular magnetic fields, for shaping the plasma cloud, and the preliminary cleaning processes prior to the plasma etching.

Furthermore, at least one etching step is carried out with error correction by using a sequence of suitable subprocesses.

It is also possible to provide that at least one etching step, performed as a second subprocess with respect to the patterning of the primary mask substrate, or a substep thereof performed as first subprocess, is carried out with error correction.

The method is preferably used to fabricate a photomask, in particular, a transmission mask or a reflection mask.

In this case, a resist layer with a thickness of 300 to 400 nm is formed as the primary mask substrate.

Furthermore, it is then possible for a partially transparent layer, such as for example, a molybdenum layer, to be applied to the surface region of the carrier substrate as a secondary mask layer, and then for a chromium layer to be applied to the partially transparent layer, in each case in a thickness of approximately 70 to 100 nm.

On the other hand, it is conceivable for the method to be used to fabricate an etching mask, in particular, on a semiconductor substrate or the like, which then serves as the carrier substrate. Then, by using the basic semiconductor substrate or the like, by using the etching mask, a corresponding semiconductor circuit configuration is formed in the semiconductor substrate or the like.

In this case, a silicon oxide, a silicon nitride and/or the like is used as the secondary mask substrate.

These and further properties and advantages of the present invention will be explained in more detail below with reference to the explanations which follow:

Basic ideas for the present invention result from the fact that, in radial process footprint structures, the patterns that are formed during fabrication of a mask configuration are larger or smaller at the edge of the mask substrate or the wafer than in the center after developing and/or etching has taken place.

Hitherto, this problem has been avoided—although almost never completely—by using complex tuning throughout the entire range of parameters of the process sequence to form a process which is as flat as possible and produces similar feature sizes or pattern deviations in the center of the mask substrate or wafer to those formed at its edge.

According to the invention, it is proposed for the respective developing processes and/or etching processes to be divided into two subprocesses. The respective etching process is preferably divided into two subprocesses. In this case, by way of example, the first subprocess may have a negative footprint, i.e. the patterns in the center of the substrate are smaller than at the edge of the substrate. By contrast, the second subprocess is selected in such a way that it has a positive footprint, i.e. the patterns in the center of the substrate are larger than at the edge. On account of the oppositely directed deviations of the individual subprocesses, which are designed such that they are afflicted with a negative or positive footprint, the choice of a suitable temporal sequence of the two subprocesses with respect to one another results in a flat overall process in which the features in the center and at the edge of the substrate are approximately the same size. In this way, it is possible to achieve a flat overall process without having to significantly change other process parameters apart from the process duration.

The procedure is particularly advantageous because the demands imposed on the flatness of the fabrication methods are growing dramatically with the increasing integration density and with each new technology generation.

Other features which are considered as characteristic for the invention are set forth in the appended claims.

Although the invention is illustrated and described herein as embodied in a method for fabricating a mask configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
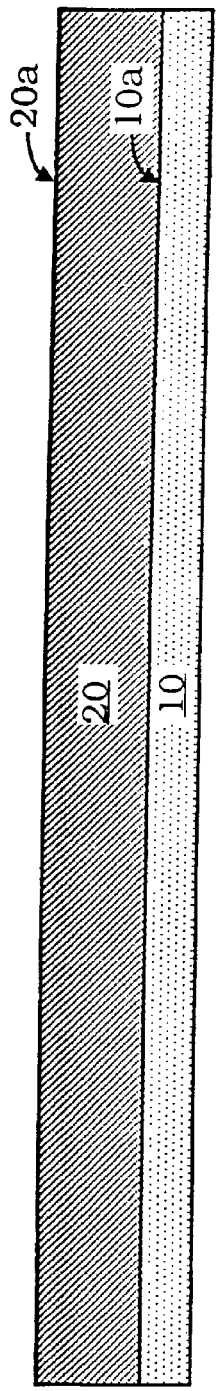
FIGS. 1–3 are diagrammatic, lateral cross-sectional views of intermediate stages of an embodiment of an inventive method.

Referring now to the figures of the drawing in detail and first, particularly, to FIGS. 1 to 3 thereof, an embodiment of the inventive method will be explained. First of all, a carrier substrate 10 with a surface 10a is provided, and a mask substrate 20 with a surface region 20a is deposited on it, as shown in FIG. 1.

Figure 2A:
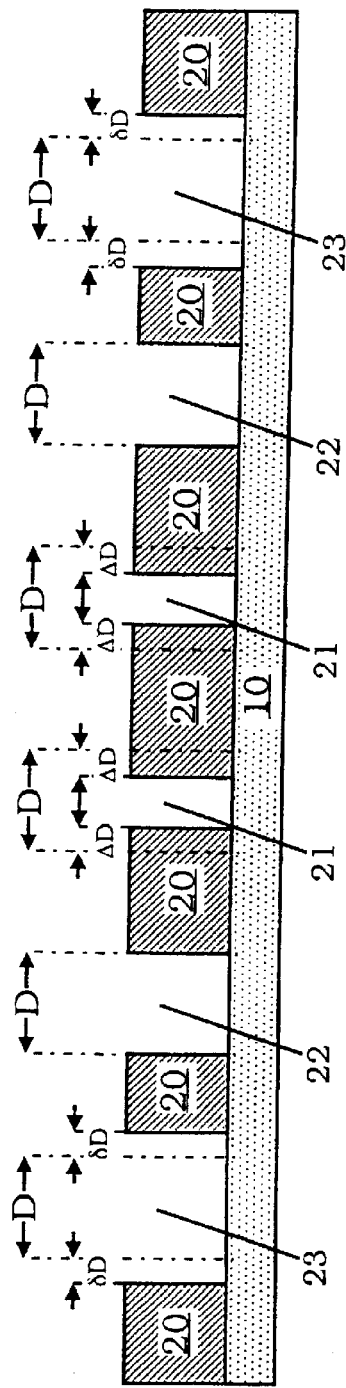

In the transition to the intermediate state shown in FIG. 2A, recesses 21, 22 and 23 have now been formed in the mask substrate 20, extending from the surface region 20a of the mask substrate 20 to the surface region 10a of the carrier substrate 10. The patterning process P1 which has been carried out in the transition from FIG. 1 to FIG. 2 is afflicted with errors to the extent that the desired extent D cannot be achieved for all of the recesses 21, 22 and 23 illustrated. The process P1 carried out in this way therefore has a negative footprint, since the recess 21 in the center deviates by the deviation ΔD from the desired extent D and is too small with respect to the latter. By contrast, the recesses 23 which are located at the edge deviate by δD from the desired extent D and are consequently too large. By contrast, the recesses 22 formed between them are dimensioned correctly with the recess D.

Figure 2B:
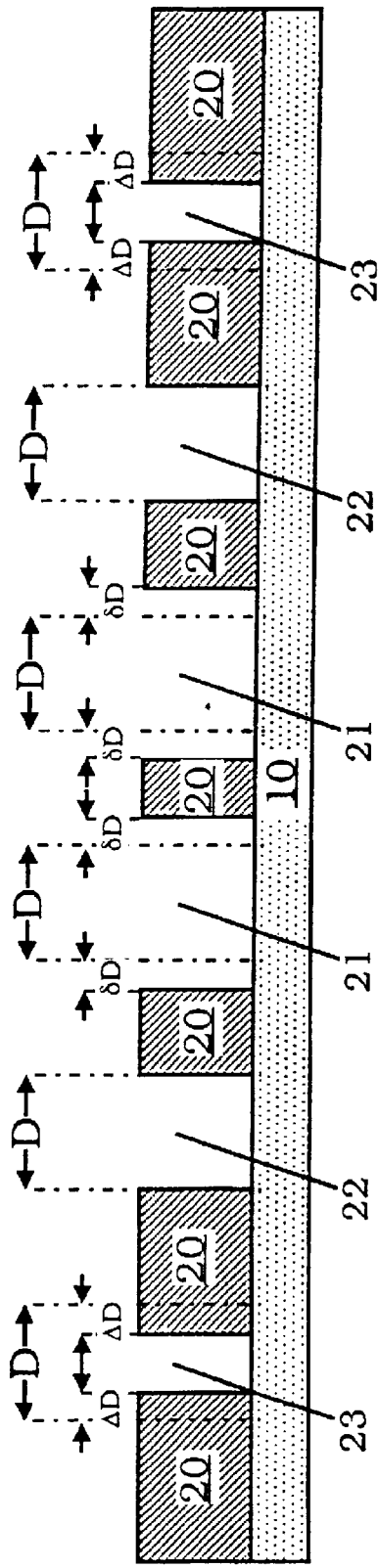

By contrast, FIG. 2B shows the result of a substantially similar subprocess P2, but in this case this subprocess produces a positive footprint. In this case, the central recesses 21 deviate by being larger by δD than the desired extent D, while the recesses 23 located at the edge are too small by ΔD with respect to the desired extent D.

Figure 3:
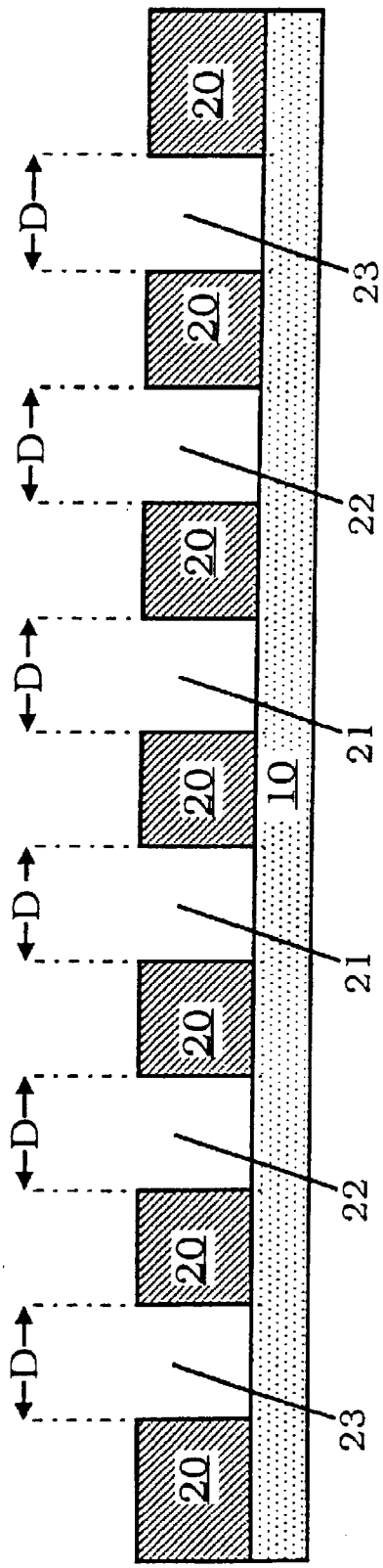

By suitably selecting the process times TP1 and TP2 for the subprocesses P1 and P2 and suitably selecting the process durations ΔTP1 and ΔTP2, the result illustrated in FIG. 3 is achieved, in which all the recesses 21, 22 and 23 are patterned with a substantially uniform desired recess D. This means that those recesses which are etched too quickly in the lateral direction in the first subprocess are etched more slowly in the lateral direction during the subsequent second subprocess, specifically in such a manner that overall, the lateral extents after the total process time ΔTP1+ΔTP2 are in each case D.

Figure 4:
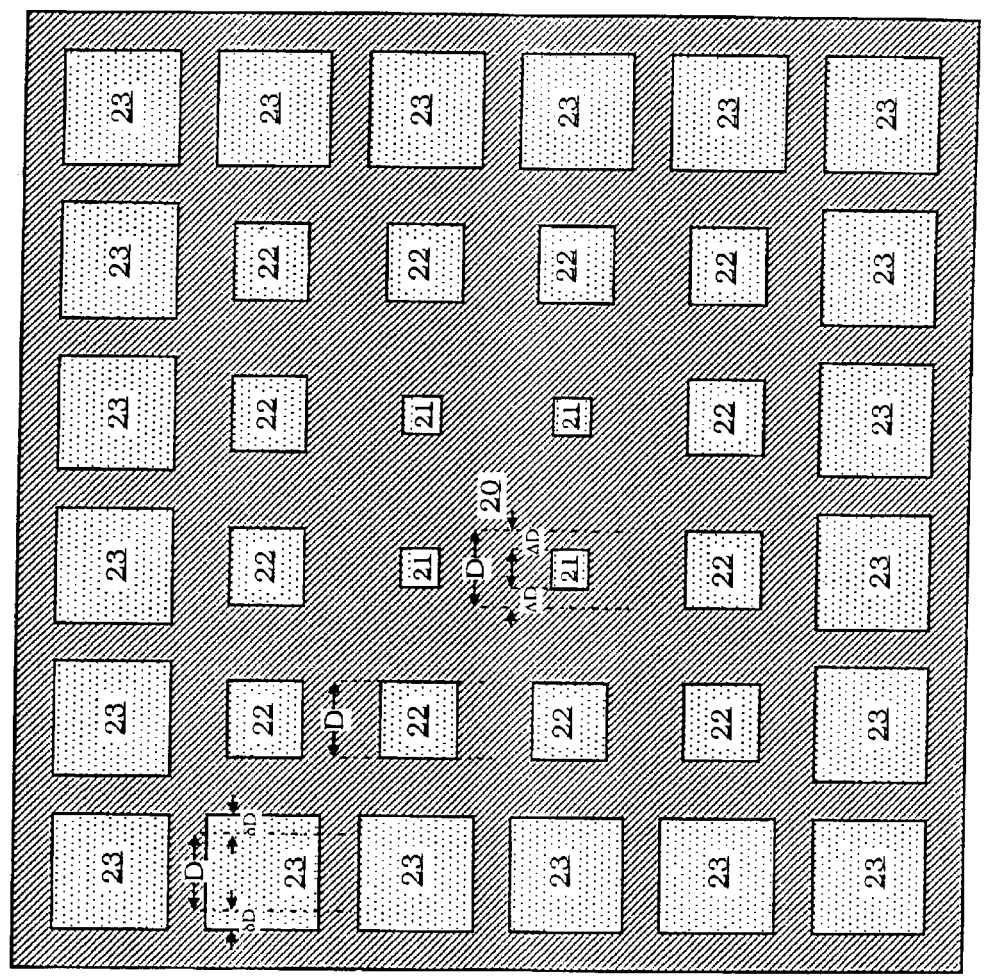
FIGS. 4–6 are diagrammatic, plan views of intermediate stages of another embodiment of an inventive method
Figure 5:
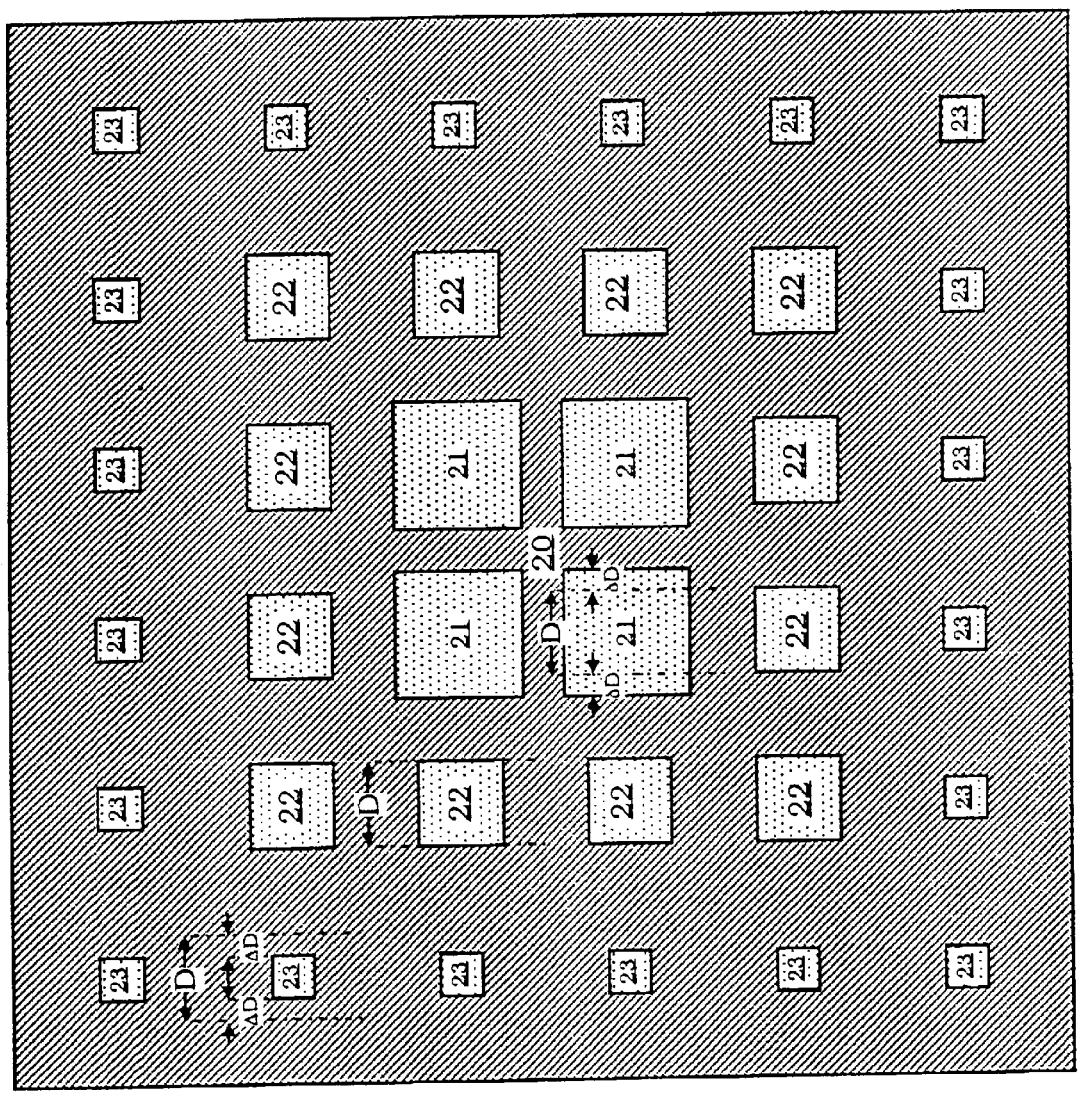
Figure 6:
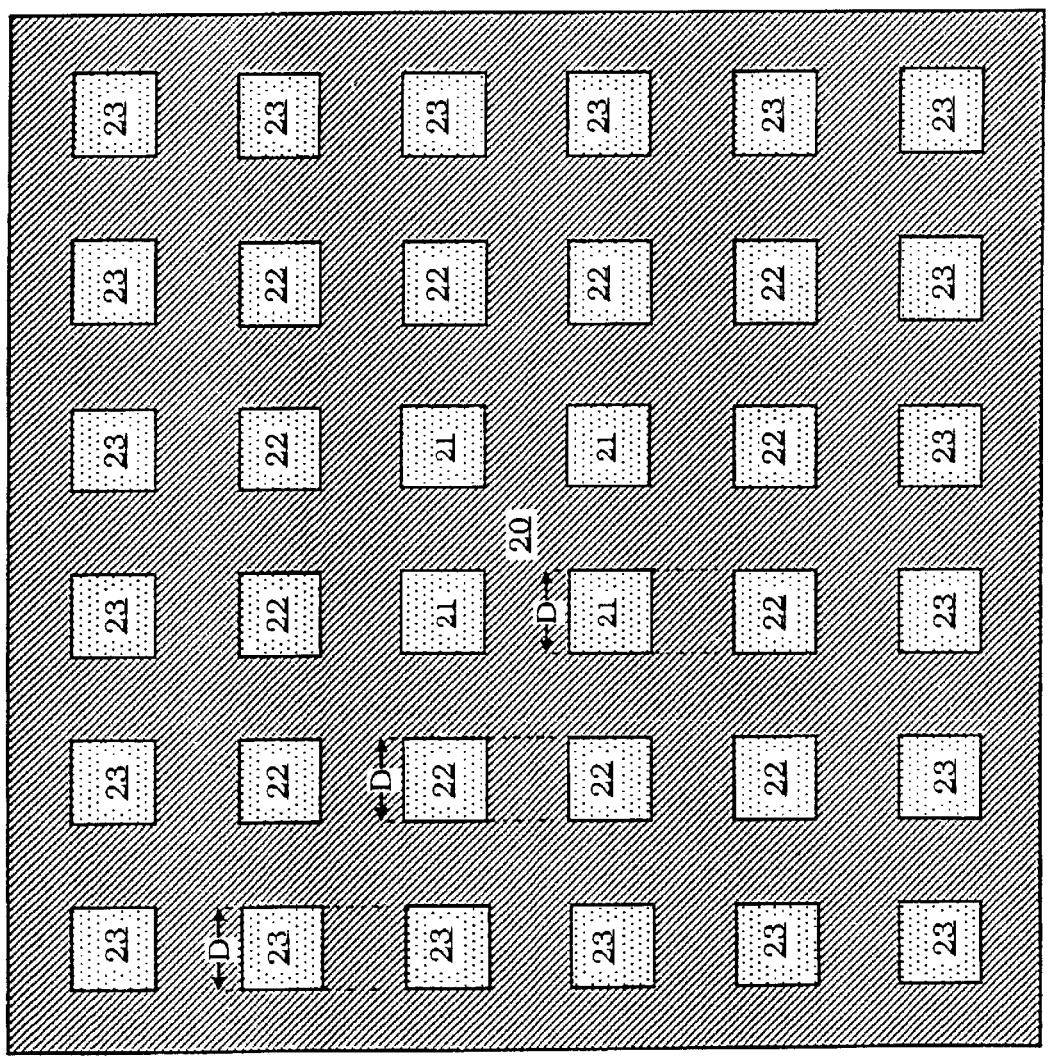

FIGS. 4 to 6 show plan views, from above, of the views illustrated in FIGS. 2A, 2B and 3. FIG. 4 illustrates a pattern with a negative footprint, FIG. 5 illustrates a pattern with a positive footprint, and FIG. 6 illustrates a pattern without a footprint or with a shallow footprint, in which each of the recesses 21, 22 and 23 has the same lateral extent D.

I claim:

1. A method for fabricating a mask configuration, which comprises:
   providing a carrier substrate having a surface region;
   forming a mask substrate on the surface region of the carrier substrate;
   patterning the mask substrate to form a mask with a configuration of recesses therein extending from a surface region of the mask substrate to the surface region of the carrier substrate;
   performing a sequence of two subprocesses to carry out the patterning of the mask substrate, a first subprocess of the two subprocesses being chosen to have a negative footprint, a second subprocess of the two subprocesses being chosen to have a positive footprint; and
   performing the subprocesses such that deviations in the configuration of the recesses in the mask, from a desired configuration, which occur as a result of each of the subprocesses, are compensated for as much as possible by a compensation, which is selected from a group consisting of a local compensation and a global compensation, such that the configuration of the recesses in the mask deviates as little as possible from the desired configuration, and as a result, the patterning of the mask substrate is carried out with error correction, the compensation being carried out as a footprint correction with the negative footprint and the positive footprint substantially compensating each other.

2. The method according to claim 1, wherein: the sequence of the subprocesses form a substep selected from a group consisting of a continuous substep and an inherent substep.

3. The method according to claim 1, wherein: the subprocesses are substantially similar processes.

4. The method according to claim 1, wherein: the subprocesses are matched by process parameters of the subprocesses.

5. The method according to claim 1, wherein: the subprocesses and the compensation for the deviations produced by the subprocesses are matched using aspects selected from a group consisting of process times and process durations.

6. The method according to claim 1, wherein: the substep has systematic deviations and is carried out with error correction.

7. The method according to claim 6, wherein: the deviations are a footprint pattern.

8. The method according to claim 6, wherein: the deviations are radially symmetrical deviations with respect to a lateral extent of the mask substrate.

9. The method according to claim 6, wherein: the deviations are side-to-side deviations.

10. The method according to claim 1, wherein: the substrate is a multilayer mask substrate having a plurality of individual layers configured one above another.

11. The method according to claim 10, which comprises: patterning each one of the individual layers independently of one another in a respective individual patterning process.

12. The method according to claim 11, which comprises: performing the individual patterning process with individual error correction using a sequence of suitable subprocesses.

13. The method according to claim 11, which comprises: performing the individual patterning process with error correction with respect to one another using a sequence of suitable subprocesses.

14. The method according to claim 10, which comprises: forming a photoresist layer with a surface region as a top layer of the mask substrate.

15. The method according to claim 10, which comprises: forming a photoresist layer with a surface region as a primary mask substrate of the mask substrate.

16. The method according to claim 15, which comprises: performing an exposure and a subsequent development to pattern the photoresist layer.

17. The method according to claim 16, wherein:
   a process selected from a group consisting of the exposure and the developing is carried out with error correction such that the exposure and the developing are matched to one another;
   the respective subprocesses are matched to one another by performing a step selected from a group consisting of selecting, controlling and regulating at least one feature selected from a group consisting of:
   a nature of exposure, a nature of imaging,
   a type of exposure, an exposure energy, an exposure wavelength,
   an exposure dose,
   an exposure time,
   a waiting time between exposure and developing,
   a parameter selected from a group consisting of a temperature, a pressure, and an atmosphere at a moment selected from a group consisting of before, during and after a step selected from a group consisting of the exposure and the developing,
   a developing medium,
   a developing temperature,
   a developing time,
   an application of a developing medium, the application being selected from a group consisting of a spray process, and a paddle process,
   developing substeps, breaks, and purging steps, and
   a movement at a moment selected from a group consisting of before, during and after a step selected from a group consisting of the exposure, an application of a corresponding developing medium, the developing, and purging.

18. The method according to claim 17, wherein: the movement is a rotation performed during the developing at a rotational speed of 60 to 1000 rpm.

19. The method according to claim 17, wherein: the type of exposure is selected from a group consisting of electromagnetic radiation and particle radiation.

20. The method according to claim 17, which comprises:
applying a secondary mask substrate as a lower layer; and
patterning the secondary mask substrate using at least one etching step.

21. The method according to claim 20, which comprises:
wet chemically performing at least one etching step with matching for error correction, by performing a step selected from a group consisting of selecting, controlling and regulating at least one feature selected from a group consisting of:
a composition of an etching medium selected from a group consisting of an acid, a base, and additives,
an etching temperature between 20° C. and 30° C.,
an etching duration,
an application of the etching medium, the application being selected from a group consisting of spraying, a number of nozzles, and a nozzle position,
an etching process sequence, and
a rotation at a rotational speed of 60 to 1000 rpm.

22. The method according to claim 21, wherein: the rotation is performed at a moment selected from a group consisting of before, during and after the application of the etching medium.

23. The method according to claim 21, wherein: the rotation is performed during a process selected from a group consisting of an etching and a purging.

24. The method according to claim 21, wherein: the etching process sequence includes a steps selected from a group consisting of interruptions and purging steps.

25. The method according to claim 21, wherein: the etching duration is close to 30 s.

26. The method according to claim 20, which comprises:
dry-chemically performing at least one etching step with matching for error correction, by performing a step selected from a group consisting of selecting, controlling and regulating at least one feature selected from a group consisting of:
a type of plasma,
a gas selected from a group consisting of a chlorine plasma gas, an oxygen plasma gas, a chlorine process gas, and an oxygen process gas,
a plasma pressure,
a gas pressure,
a plasma temperature,
an excitation frequency of a plasma,
a DC voltage for plasma anisotropy,
an etching duration,
an etching temperature,
magnetic fields for shaping a plasma cloud, and
preliminary cleaning processes prior to a plasma etching.

27. The method according to claim 20, wherein the at least one etching step is carried out with the error correction by using a sequence of suitable subprocesses.

28. The method according to claim 20, which comprises:
carrying out an error corrected step selected from a group consisting of a first subprocess of an etching step performed to pattern the primary mask substrate, and a second subprocess of the etching step.

29. The method according to claim 1, which comprises: fabricating a photomask.

30. The method according to claim 29, wherein: the photomask is a transmission mask with a transparent carrier substrate.

31. The method according to claim 29, wherein: the photomask is a reflection mask.

32. The method according to claim 29, which comprises: forming a primary mask substrate of the mask substrate by applying a resist layer with a layer thickness of 300 to 400 nm.

33. The method according to claim 32, which comprises:
forming a secondary mask substrate by applying a molybdenum silicide layer having a layer thickness of approximately 70 to 100 nm to the surface region of the carrier substrate; and
applying a chromium layer having a layer thickness of approximately 70 to 100 nm to the molybdenum silicide layer.

34. The method according to claim 1, which comprises: forming an etching mask on the carrier substrate.

35. The method according to claim 34, wherein: the carrier substrate is a semiconductor substrate.

36. The method according to claim 34, which comprises: forming a secondary mask substrate selected from a group consisting of silicon oxide and a silicon nitride.

* * * * *